US010930639B2

(12) United States Patent
Meng et al.

(10) Patent No.: US 10,930,639 B2
(45) Date of Patent: Feb. 23, 2021

(54) ESD PROTECTION CIRCUIT PROVIDING MULTIPLE DETECTION SIGNALS

(71) Applicant: NXP USA, INC., Austin, TX (US)

(72) Inventors: Kuo-Hsuan Meng, Austin, TX (US); James W. Miller, Austin, TX (US)

(73) Assignee: NXP USA, INC., Austin, TX (US)

(*) Notice: Subject to any disclaimer, the term of this patent is extended or adjusted under 35 U.S.C. 154(b) by 163 days.

(21) Appl. No.: 16/279,777

(22) Filed: Feb. 19, 2019

(65) Prior Publication Data

US 2020/0266187 A1  Aug. 20, 2020

(51) Int. Cl.
*H01L 27/02* (2006.01)
*H02H 9/04* (2006.01)

(52) U.S. Cl.
CPC ........ *H01L 27/0251* (2013.01); *H02H 9/046* (2013.01)

(58) Field of Classification Search
CPC .. H01L 27/0251; H01L 27/0285; H02H 9/046
USPC ......................................................... 361/56
See application file for complete search history.

(56) References Cited

U.S. PATENT DOCUMENTS

| | | | |
|---|---|---|---|
| 5,754,074 A | 5/1998 | Kelly | |
| 6,970,336 B2 | 11/2005 | Stockinger et al. | |
| 7,397,642 B2 | 7/2008 | Ker et al. | |
| 7,760,476 B2 | 7/2010 | Riviere et al. | |
| 7,782,580 B2 | 8/2010 | Gauthier, Jr. et al. | |
| 7,990,666 B2 | 8/2011 | Riviere et al. | |
| 8,010,927 B2 | 8/2011 | Gauthier, Jr. et al. | |
| 8,400,742 B2 | 3/2013 | Lai et al. | |
| 8,498,085 B2 | 7/2013 | Altolaguirre et al. | |
| 8,724,269 B2 | 5/2014 | Wang et al. | |
| 8,797,698 B2 | 8/2014 | Lai et al. | |
| 8,830,641 B2 | 9/2014 | Van Ber Borght et al. | |
| 9,059,582 B2 | 6/2015 | Lai et al. | |
| 9,634,483 B2 | 4/2017 | Huang et al. | |
| 2006/0203405 A1 | 9/2006 | Bhattacharya et al. | |
| 2008/0304191 A1* | 12/2008 | Riviere | H01L 27/0285 361/56 |
| 2010/0328827 A1* | 12/2010 | Lai | H02H 9/046 361/56 |
| 2013/0057992 A1* | 3/2013 | Altolaguirre | H02H 9/046 361/56 |

(Continued)

FOREIGN PATENT DOCUMENTS

| | | |
|---|---|---|
| CN | 102543963 | 10/2013 |
| CN | 106159924 | 1/2019 |

OTHER PUBLICATIONS

Chen, S., "Area-Efficient EDS-Transient Detection Circuit With Smaller Capacitance for On-Chip Power-Rail ESD Protection in CMOS ICs", IEEE Transactions on Circuits and Systems—II: Express Briefs, vol. 56, No. 5, May 2009.

(Continued)

*Primary Examiner* — Dharti H Patel
(74) *Attorney, Agent, or Firm* — David G. Dolezal

(57) ABSTRACT

An ESD protection circuit includes a detection circuit for detecting an ESD event. The detection circuit includes two current mirrors each for providing two detection signals. The ESD protection circuit includes driver circuitry that produces trigger signals to clamp circuits that make conductive the clamp circuits in response to an ESD event based on the detection signals from the current mirrors.

20 Claims, 5 Drawing Sheets

(56) References Cited

U.S. PATENT DOCUMENTS

| | | |
|---|---|---|
| 2013/0106518 A1 | 5/2013 | Ogasawara |
| 2013/0163129 A1 | 6/2013 | Lai et al. |
| 2014/0247526 A1 | 9/2014 | Lai et al. |
| 2014/0355157 A1 | 12/2014 | Huang et al. |
| 2016/0285257 A1* | 9/2016 | Tsaur .................... H02H 9/046 |

OTHER PUBLICATIONS

Olson, N., "Small Footprint Trigger Voltage Control Circuit for Mixed-Voltage Applications", ESDA 2008.

* cited by examiner

ESD PROTECTION CIRCUIT PROVIDING MULTIPLE DETECTION SIGNALS

BACKGROUND OF THE INVENTION

Field of the Invention

This invention relates to Electrostatic Discharge (ESD) protection circuits for integrated circuits.

Background

Some integrated circuits include Electrostatic Discharge (ESD) protection circuits to protect the circuitry of the integrated circuit from an ESD event. An example of an ESD event that can occur with integrated circuits is where built up static charge on an external object (e.g. manufacturing equipment or a human) discharges to conductive structures (e.g. bond pads) of an integrated circuit. This discharge can generate abnormally high voltages and/or currents in the integrated circuit that can damage the circuitry of the integrated circuit. ESD protection circuits may include a detection circuit to detect the occurrence of an ESD event on a pad and make conductive a clamp circuit to discharge the charge of the ESD event to a ground rail of the integrated circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In some embodiments disclosed herein, an ESD protection circuit includes a detection circuit for detecting an ESD event. The detection circuit includes two current mirrors each for providing two detection signals. The ESD protection circuit includes driver circuitry that produces trigger signals to clamp circuits that make conductive the clamp circuits in response to an ESD event. The driver circuitry includes node assertion paths responsive to the detection signals for pulling circuit nodes of the driver circuitry to their asserted states during an ESD event. In some embodiments, the use of multiple detection signals and multiple assertion paths may allow for the trigger signals to be tailored in terms of speed and drive strength.

Figure 1:
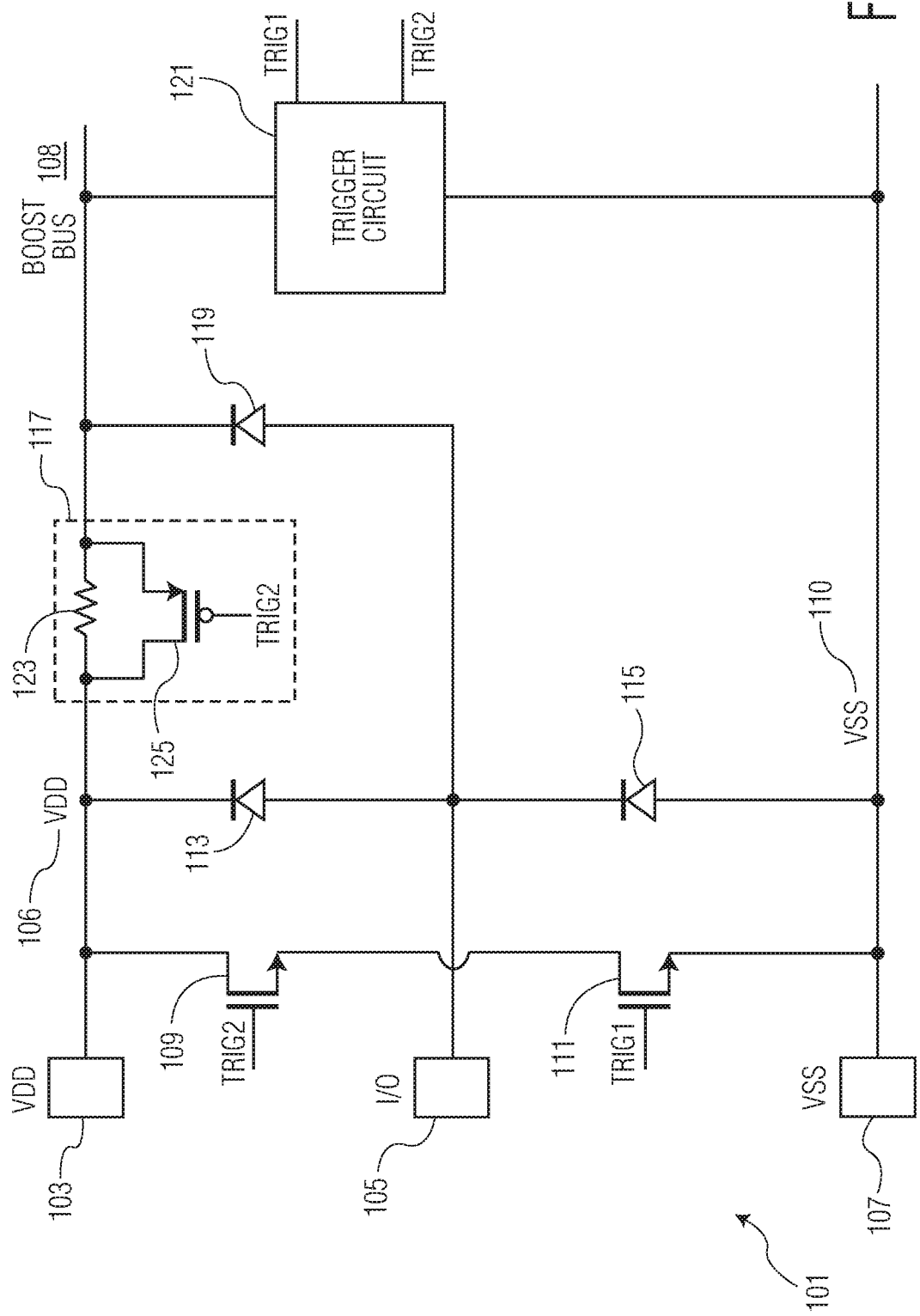
FIG. 1 is a circuit diagram of a portion of an integrated circuit according to one embodiment of the present invention.

FIG. 1 is a circuit diagram of a portion of an integrated circuit showing an ESD protection circuit according to one embodiment of the present invention. Integrated circuit 101 includes multiple external terminals (e.g. pads). In the embodiment shown, integrated circuit includes a VDD pad 103 for receiving an external power supply voltage (e.g. 3.3 volts), a VSS pad 107 for receiving a second external power supply voltage (e.g. ground), and an I/O pad 105 for receiving and/or supplying an information signal (e.g. either discrete or analog). Not shown is circuitry of integrated circuit (e.g. processing circuitry, analog circuitry, sensors, memories) for performing its intended functions. Such circuitry would be coupled to receive the power supply voltages from pads 103 and 107 and coupled to transfer information via pad 105. The integrated circuit may include more pads (not shown). In other embodiments, an integrated circuit may include other types of external terminals (e.g. posts, bumps).

In the embodiment shown, circuit 101 includes diodes 113, 119, and 115 for shunting current from an ESD event from either pad 105 or pad 107 to both a VDD power rail 106 and a boost bus 108. A boost bus may be characterized as a power rail for ESD circuitry. During an ESD event, current shunted to boost bus 108 and VDD power rail 106 raises the voltage of the boost bus 108 such that trigger circuit 121 will assert trigger signals TRIG1 and TRIG2 to make conductive clamps 109 and 111 (which are implemented as NFETs in the embodiment shown) to clamp VDD rail 106 to VSS rail 110 such that the ESD event current is discharged to rail 110 and to reduce that large voltage differential across the circuitry of integrated circuit 101 due to the ESD event. During an ESD event applied to pad 105 with pad 107 grounded, high ESD currents, often on the order of amperes, flow through diode 113 to VDD rail 106, and then to the ground rail 110, via clamps 109 and 111. A much smaller current is needed to power the trigger circuit 121 via diode 119 to boost bus 108. Due to these differences in current magnitude, and related IR drops in the two current paths, the trigger circuit 121 sees a boost bus voltage often well in excess of the VDD bus voltage seen by the drain terminal of clamp 109. The result is that the control electrodes of clamps 109 and 111 are often driven well above the VDD bus voltage. This can significantly increase the conductance of clamps 109 and 111, such that the desired clamp can be achieved in a compact area.

In the embodiment shown, integrated circuit 101 includes a boost circuit 117 to allow the boost bus 108 to rise to a higher voltage than VDD rail 106 during the assertion of the trigger signals so as to turn on clamps 109 and 111 more strongly, while keeping the boost bus 108 and the VDD rail 106 at the same potential when the trigger signals are not asserted. In the embodiment shown, circuit 117 includes a resistor 123 and a PFET transistor 125 whose control electrode is connected to receive the TRIG2 signal. Prior to the assertion of the TRIG2 signal, transistor 125 is conductive such that rail 106 and boost bus 108 are at about the same potential. Once the trigger signals are asserted during an ESD event, transistor 125 becomes non-conductive, so the boost bus 108 can still be maintained at a higher potential, even when the VDD rail 106 is clamped low by the clamps 109 and 111. However, a boost circuit 117 may have other configurations in other embodiments. In one embodiment, diode 119 is sized such that it directs a limited amount of ESD energy to boost bus 108. Also in some embodiments, boost bus 108 can be made relatively resistive to limit the current on the bus during an ESD event.

Some integrated circuits of other embodiments may not include a boost bus 108 and boost circuit 117. In some such embodiments, the trigger circuit is connected to the VDD rail 106 where the trigger circuit 121 detects an ESD event on the VDD rail 106 and the voltage of rail 106 is provided to the driver circuitry of circuit 121 to produce the trigger signals to drive clamps 109 and 111.

In other embodiments, boost bus 108 would be coupled via diodes (not shown) to multiple I/O pads (not shown). In some embodiments, the boost bus runs along the perimeter of the integrated circuit and is coupled to the VDD rail 106 with boost circuits (117) at multiple locations. In some embodiments, an integrated circuit may include multiple boost buses for each power supply rail. In other embodiments, multiple trigger circuits (not shown) located throughout the integrated circuit perimeter would be connected to boost bus 108. In some such embodiments, the trigger signals from the multiple trigger circuits would be provided to a trigger circuit bus where each trigger signal (TRIG1, TRIG2) would have its own trigger signal bus. Each trigger signal bus would be connected to multiple clamps located through the perimeter of the integrated circuit. For example, a trigger signal bus (not shown) for signal TRIG1 could be driven by any one of a number of trigger circuits (121) distributed around integrated circuit 101 and coupled to boost bus 108 to provide a trigger signal TRIG1 to a number of clamps similar to clamp 111 to close the clamps in response to a detection of an ESD event. However, an ESD circuit may have other configurations in other embodiments.

Figure 2:
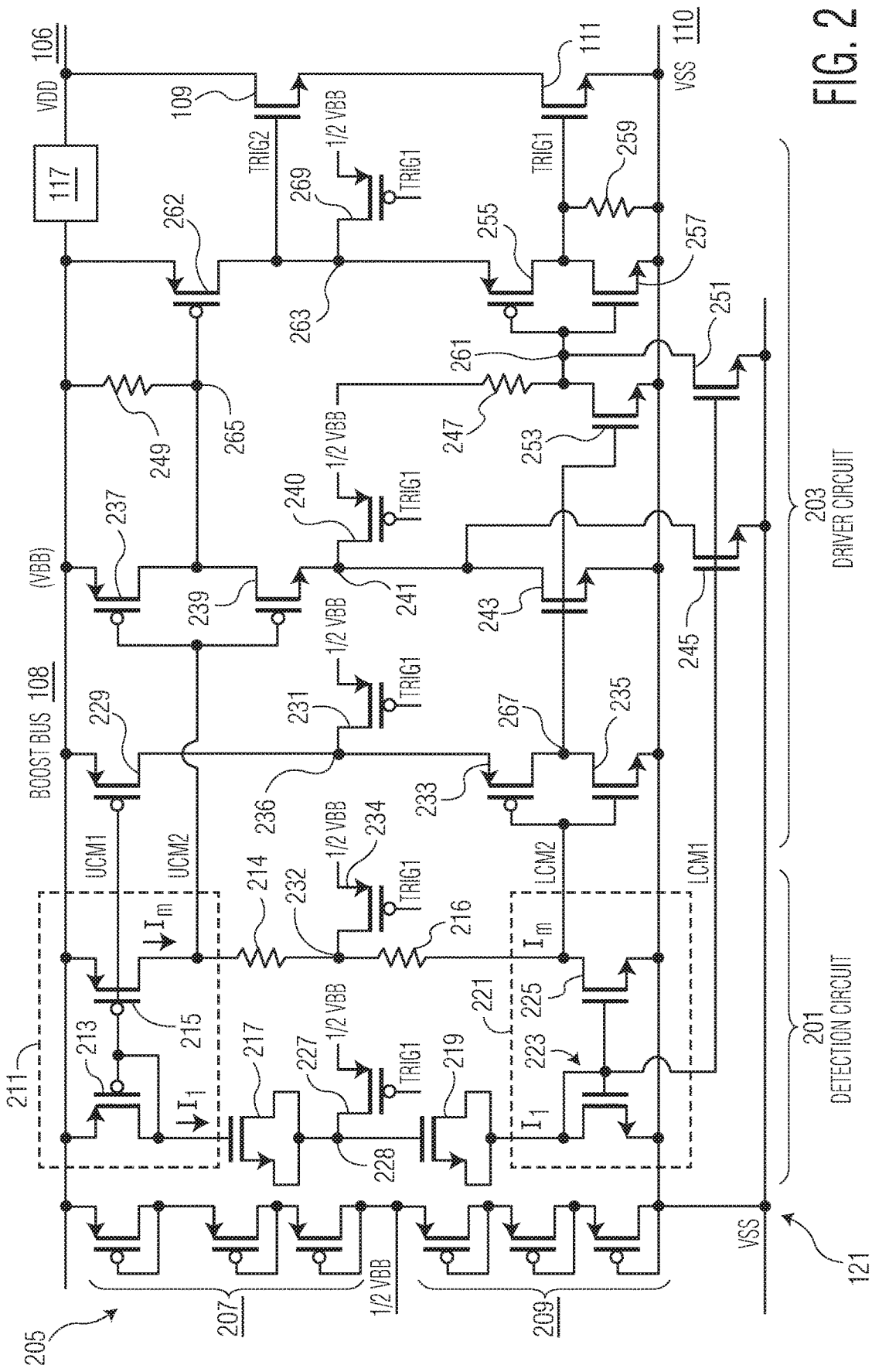
FIG. 2 is a circuit diagram of an ESD protection circuit of FIG. 1 according to one embodiment of the present invention.

FIG. 2 is a circuit diagram of trigger circuit 121 and other circuitry of an ESD protection circuit of FIG. 1. Trigger circuit 121 includes a detection circuit 201 for detecting an ESD event on boost bus 108 and a driver circuit 203 for asserting trigger signals (TRIG1 and TRIG2) in response to a detected ESD event.

In the embodiment shown, trigger circuit 121 includes a bias circuit 205 for producing a bias voltage (½ VBB) that is one half the voltage (VBB) of boost bus 108. Circuit 205 includes both a stack of PFETs 207 and a stack of PFETs 209. The bias voltage is provided to nodes 228, 232 236, 241, and 263 of detection circuit 201 and driver circuit 203 via transistors 227, 234, 231, 240, and 269, respectively, to bias the nodes at ½ VBB during normal operation (which is approximately ½ VDD when transistor 125 is closed). This is to ensure that no device is stressed beyond its nominally allowed voltage range during normal operation, so as to avoid potential degradation. In the embodiment shown, the nominally allowed voltage range is between 0 and ½ VDD. When an ESD event is detected, transistors 227, 234, 231, 240, and 269 are made non-conductive to where the nodes are not biased at ½ VBB. During the short duration of an ESD event, however, the overstress is limited in time. So, in some embodiments, it may be acceptable to allow the devices to briefly operate beyond their allowed ranges in order to make the trigger circuit more effective.

Detection circuit 201 includes two current mirrors 211 and 221. Current mirror 211 includes a master device 213 and a mirror device 215. Master device 213 is implemented as a diode configured PFET and mirror device 215 is implemented as a PFET. Current mirror 221 includes a master device 223 and a mirror device 225. Master device 223 is implemented as a diode configured NFET and mirror device 225 is implemented as an NFET. Circuit 201 includes capacitors 217 and 219 (implemented as capacitor configured NFETs) and resistors 214 and 216. The drain (a current electrode of a FET) of master device 213 provides an upper primary detection signal (UCM1), the drain of the mirror device 215 provides the upper secondary detection signal (UCM2), the drain of master device 223 provides the lower primary detection signal (LCM1) and the drain of mirror device 225 provides the lower secondary detection signal (LCM2).

In the embodiment shown, detection circuit 201 detects whether an ESD event is occurring by monitoring the voltage slew-rate (dV/dt) of boost bus 108. Circuit 201 is designed to distinguish between a faster rise-time of a typical ESD event and a slower rise-time of a normal power-up event of an integrated circuit. In the embodiment shown, when there is a change in voltage on the boost bus 108, the voltage slew-rate between bus 108 and VSS rail 110 becomes non-zero. If the slew-rate is small enough (for example, if the rise-time is much longer than the RC time constant of capacitor 217 and master device 213 (configured as a diode) and the time constant of capacitor 219 and master device 223), then no ESD event is considered to have occurred. In such a case, the increase in the voltage differential between bus 108 and rail 110 is fully dropped on capacitors 217 and 219 and the voltage drop across master devices 213 and 223 does not increase. An ESD event is determined to occur if the slew-rate on boost bus 108 exceeds the threshold set by the time constants. In such a condition, the increase in voltage differential between bus 108 and rail 110 is partially dropped across master devices 213 and 223 which causes the primary upper detection signal (UCM1) to go lower than VBB and the primary lower detention signal (LCM1) to rise higher than VSS, each which indicates a detection of an ESD event.

As UCM1 drops further below VBB to indicate an ESD event, then mirror device 215 becomes more to conductive to pull the voltage of UCM2 towards VBB to indicate an ESD event. Also, as LCM1 rises further above VSS, mirror device becomes more conductive where LCM2 is pulled closer to VSS to indicate an ESD event. Accordingly, UCM1 and LCM1 may be considered complementary signals to UCM2 and LCM2, respectively. In other embodiments, a detection circuit may have other configurations and/or operate in a different way to detect an ESD event. Also in other embodiments, a detection circuit may produce a different number of detection signals.

Driver circuit 203 includes two trigger paths. One path is for producing the TRIG2 signal and the other path for producing the TRIG1 signal. Each path includes multiple inverter buffer stages. In the embodiment shown, the paths share buffer stages. The two paths include inputs for receiving multiple detection signals (UCM1, UCM2, LCM1, and LCM2) for producing the trigger signals. Driver circuit 203 includes transistors 229, 233, 235, 237, 239, 243, 245, 253, 251, 255, 257, and 262. Driver circuit also includes resistors 249, 247, and 259.

During normal operation when no ESD event is detected, signals UCM1 and LCM2 are at relatively high voltage levels and signals UCM2 and LCM1 are at relatively low voltage levels. Nodes 228, 232, 236, 241, and 263 are at ½ VBB (which is approximately ½ VDD). Node 267 is at a relatively low voltage level (VSS) and node 261 is at a relatively high voltage level (½ VBB). Node 265 is at a relatively high voltage level (VBB). TRIG1 is at a relatively low voltage level (VSS) and TRIG2 is at a relatively low voltage level (½ VBB) where neither clamp 109 nor clamp 111 are conductive.

Upon the detection of an ESD event, UCM2 and LCM1 transition to a relatively high voltage level, and UCM1 and LCM2 transition to a relatively low voltage level. Accordingly, node 267 transitions to a high voltage asserted state (½ VBB prior to TRIG1 being asserted) and transistor 229 becomes conductive. Node 265 transitions to a low voltage asserted state (½ VBB prior to TRIG1 being asserted) and node 261 transitions to a low voltage asserted state (VSS). Node 265 being at a low voltage makes transistor 262 conductive to pull the TRIG2 to an asserted VBB voltage, and node 261 going to a low voltage asserted state causes TRIG1 to be pulled high to make clamp 111 conductive.

When TRIG1 becomes asserted during an ESD event, transistors 227, 234, 231, 240, and 269 become deactivated, so nodes 228, 232, 236, 241, and 263 are no longer biased at ½ VBB. Accordingly, node 236 is further pulled towards VBB in that UCM1 is at a relatively low level. The voltage of node 236 going even further higher makes both transistors 243 and 253 more conductive which pulls both nodes 241 and 261 harder towards VSS. Node 261 being pulled harder towards VSS along with node 263 being pulled higher due to it no longer being biased at ½ VBB drives TRIG1 harder. Because nodes 228, 232, 236, 241, and 263 are biased at ½ VBB before TRIG1 is asserted and not biased at ½ VBB after the TRIG1 is as asserted, the voltage level of an asserted state of a node may change.

The use of two current mirrors to generate additional detection signals may allow for a driver circuit to implement multiple node assertion paths to pull a node to an asserted state during an ESD event. A node assertion path is any path that pulls a circuit node to its asserted state during an ESD event. As shown in FIG. 2, signals UCM1 and LCM2 are at low assertion states to indicate an ESD event. This pulls node 267 higher to make transistor 253 conductive to pull node 261 towards VSS, which is its asserted state during an ESD event. In addition, the use of the asserted high LCM1 signal makes transistor 251 conductive to also pull node 261 towards VSS (its asserted state).

In addition, the use of a current mirror to generate an additional detection signal may allow for a reduction in the amount of driver circuitry. As shown in FIG. 2, because mirror 211 produces both UMC1 and UMC2 signals that are considered complementary, opposing values of the upper detection signal can be implemented without having to use additional cascading inverter circuitry. For example, an upper detection signal with an asserted low state indicating an ESD event (UCM1) is provided to the inverter buffer stage of transistors 229, 233, and 235. An upper detection signal with an asserted high state indicating an ESD event (UCM2) is provided to the inverter buffer stage of transistor 237, 239, and 243 and the inverter buffer stage of transistor 237, 239, and 245.

The use of two node assertion paths to pull node 261 towards its asserted state allows driver circuit 203 to have a more "tailored" response to an ESD event in that the different paths can have different response characteristics to an ESD event. For example, using LMC2 (and UCM1) to drive the inverter buffer stage output of transistors 229, 233, and 235 to make transistor 253 conductive to pull node 261 to VSS may have a stronger signal strength during an ESD event (which provides for a stronger clamp conductance). Whereas the path of signal LCM1 driving transistor 251 to pull node 261 towards VSS is faster (does not have an intervening inverter buffer stage). Accordingly, the use of both node assertion paths to pull node 261 towards VSS and thus drive the TRIG 1 signal allows the TRIG1 signal to have a faster component in being driven to an asserted state (from transistor 251) and yet have a stronger drive signal strength at later times during the ESD event (from the inverter of transistor 253). This can make the clamp devices become conductive faster in response to an ESD event which reduces VDD stress during the earlier part of the ESD event.

Also, driver circuit 203 includes two assertion node paths for pulling node 241 towards VSS during an ESD event after transistor 240 is made non-conductive. One node assertion path is where signals LMC2 and UCM1 drive the inverter buffer stage output node 267 of transistors 229, 233, and 235 to make transistor 243 conductive, and the other path is signal LCM1 driving transistor 245 to be more conductive. The use of two paths in this instance pulls node 241 faster towards its asserted state of VSS after the TRIG1 signal has been asserted.

After the ESD event has dissipated, the signals of detection circuit 201 transition to their non-asserted states (UMC1 is high, UCM2 is low, LCM1 is low, and LCM2 is high) to place the nodes of circuit 203 in non-asserted states. For example, UCM2 going to a low state and LCM2 going to a high state drives the inverter stage of transistors 237, 239, and 243 to pull node 265 high to make transistor 262 non-conductive. Signals UCM1 and LCM2 going high pulls node 267 towards VSS which make transistor 253 non-conductive, allowing the resistor 247 to pull node 261 high to pull the TRIG1 signal low to turn off clamp 111 (signal LCM1 transitions to a low voltage to make transistor 251 non-conductive).

In other embodiments, a driver circuit may have other configurations, operate in other ways, and/or may have other circuitry. For example, although driver circuit 203 is implemented with multiple inverter buffer stages, other embodiments may include amplifier stages and non-inverting buffer stages. Also, the circuitry that receive the primary detection signals (UCM1 and LCM1) may instead receive the secondary detection signals (UCM2 and LCM2) and vice versa wherein the circuitry includes the appropriate inverter stages or is configured accordingly.

Figure 3:
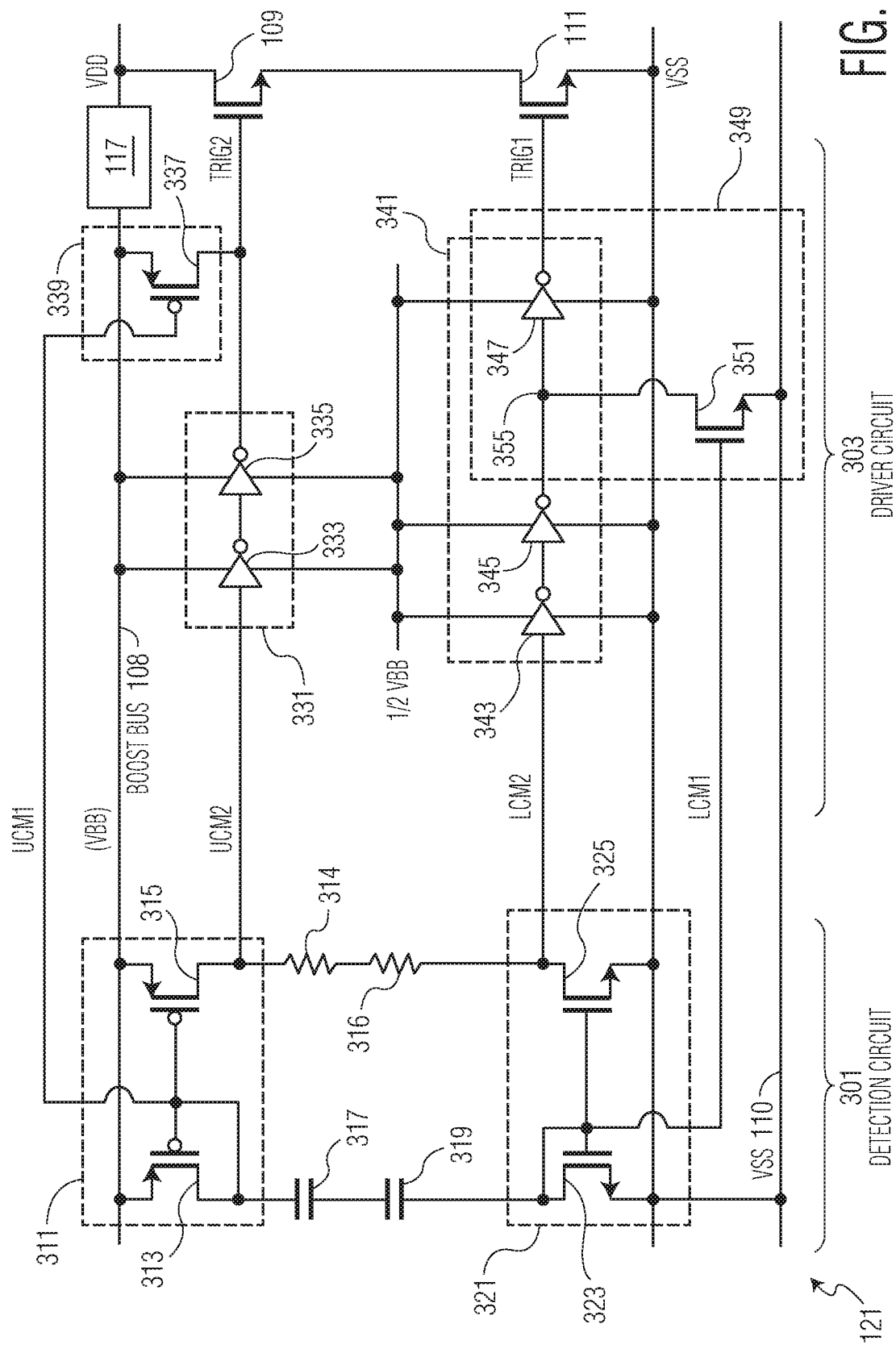
FIG. 3 is a circuit diagram of an ESD protection circuit of FIG. 1 according to another embodiment of the present invention.

FIG. 3 is a circuit diagram of another embodiment of trigger circuit 121 according to the present invention. Detection circuit 301 includes current mirrors 311 and 321. Current mirror 311 includes master device 313 and mirror device 315. Current mirror produces upper detection signals UMC1 and UMC2 which are asserted low and high, respectively, during an ESD event. Current mirror 321 includes master device 323 and mirror device 325 and produces lower detection signals LCM1 and LCM2 which are asserted high and asserted low, respectively, during and ESD event. Detection circuit 301 also includes capacitors 317 and 319 and resistors 314 and 316. In one embodiment, capacitors 317 and 319 are implemented as capacitor configured transistors. Detection circuit 301 works similarly to detection circuit 201 except that the node between the resistors 314 and 316 and the node between capacitors 317 and 319 are not biased at ½ VBB when the TRIG1 signal is non-asserted. In other embodiments of detection circuit 301, the same bias circuitry like that in 201 can be added to provide a ½ VBB bias to the node between resistors 314 and 316 and the node between capacitors 317 and 319.

Driver circuit 303 includes trigger path circuitry for producing the TRIG2 signal and the TRIG1 signal to drive clamps 109 and 111, respectively, during an ESD event. TRIG1 is generated by the LCM2 signal controlling a series of inverting buffers (inverters 343, 345, and 347) and the LCM1 signal driving transistor 351. The TRIG2 signal is generated with signal UMC2 controlling a series of inverting buffers (inverters 333 and 335) and the UMC1 signal driving transistor 337. In the embodiment shown, inverters 333, 335, 343, 345, and 347 have a power terminal that is biased at ½ VBB from a bias circuit not shown in FIG. 3.

In the embodiment of FIG. 3, driver circuit 303 includes two node assertion paths for pulling the voltage of the TRIG2 signal towards its asserted state (VBB) during an ESD event. The path 331 of inverters 333 and 335 pull TRIG2 towards VBB in response to the UMC2 detection signal transitioning to a high state during an ESD event, and transistor 337 is made conductive in response to the UCM1 detection signal transitioning to an asserted low state during an ESD event. The latter path 339 (transistor 337) is faster in pulling the TRIG2 signal to the asserted state than the path 331 of inverters 333 and 335 in that it has fewer stages in the path. However, the path of inverters 333 and 335 is slower but stronger and provides for a greater clamp conductance in the later stages of the ESD event.

Driver circuit 303 also includes two assertion node paths in producing the TRIG1 signal. An asserted low LCM2 signal controls inverters 343 and 345 to pull node 355 towards VSS during an ESD event. An asserted high LCM1 signal makes transistor 351 conductive to pull node 355 to VSS during an ESD event. The path of inverters 343 and 345 is a stronger but slower path in pulling node 355 towards VSS, but the node assertion path of transistor 351 is faster in that it includes fewer stages. In other embodiments, circuit 303 may be configured such that the paths 331 and 341 receive the UCM1 and LCM1 signals, respectively, and transistors 337 and 351 be configured to receive the UCM2 and LCM2 signals, respectively, when the circuit is configured appropriately.

Figure 4:
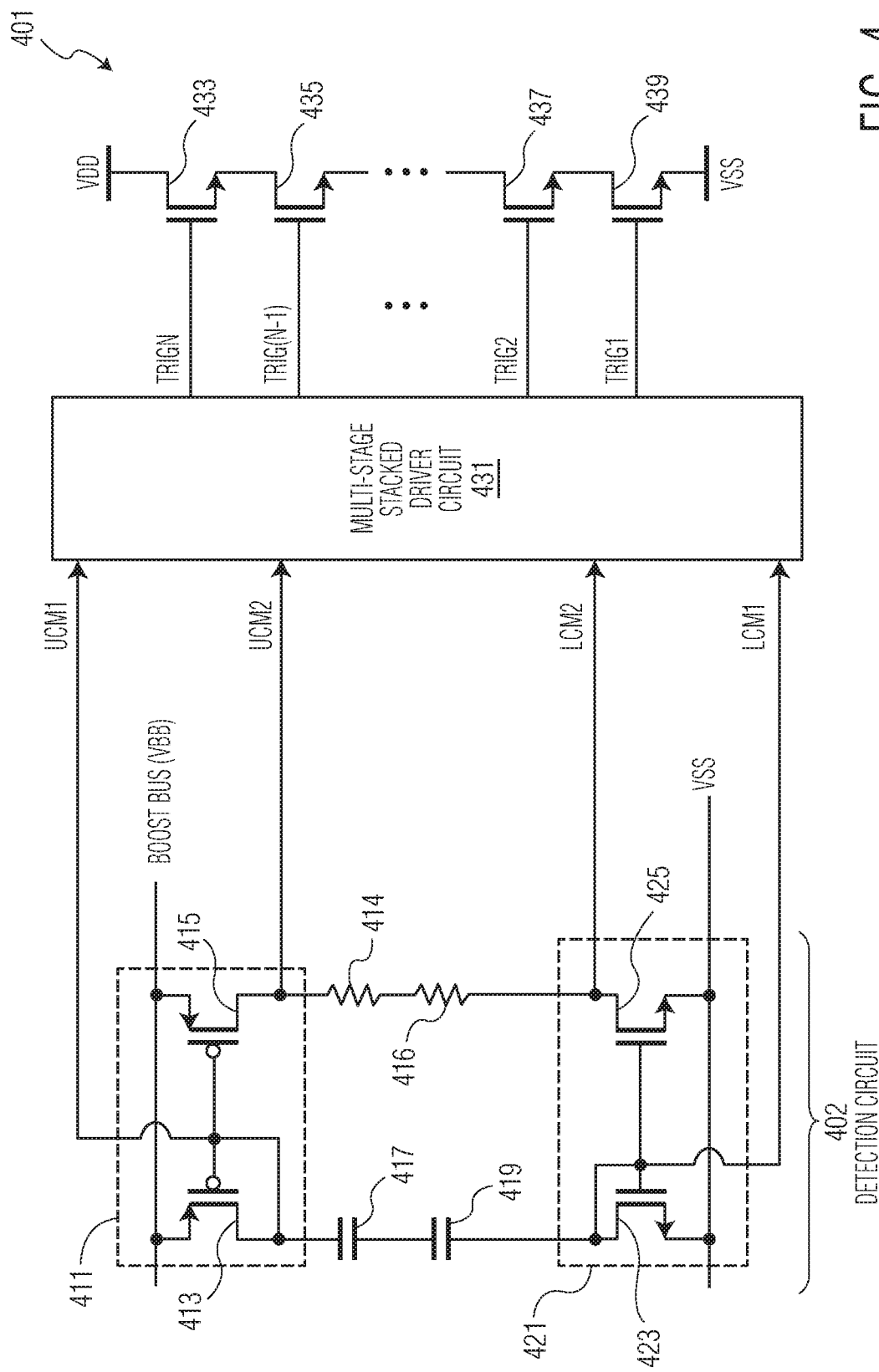
FIG. 4 is a circuit diagram of an ESD protection circuit according to another embodiment of the present invention.

FIG. 4 is a circuit diagram of an ESD protection circuit 401 according to another embodiment of the present invention. Circuit 401 includes a detection circuit 402. Circuit 402 includes current mirrors 411 and 421, master devices 413 and 423, mirror devices 415 and 425, capacitors 417 and 419, and resistors 414 and 416, which are all similar to the corresponding devices of detection circuit 301 of FIG. 3. Circuit 402 produces asserted high UCM2 and LCM1 detection signals and asserted low UCM1 and LCM2 detection signals in response to an ESD event. Circuit 401 includes a multi-stage stacked driver circuit 431 for providing multiple trigger signals (TRIG1-TRIGN) to stacked clamps (433, 435, 437, and 439). Driver circuit 431 may include inverting buffers, resistors, amplifiers, and/or non-inverting buffers (none shown) implemented in a stacked configuration for providing the stacked trigger signals (TRIG1-TRIGN). During an ESD event, the drive circuit 431 pulls all the trigger signals (TRIG1-TRIGN) to their corresponding asserted states in response to the detection signals (UCM1, LCM1, UMC2, and LCM2) being in their corresponding asserted states. In the embodiment shown, when the detection circuit detects an ESD event and asserts all the detection signals (UCM1, LCM1, UMC2, and LCM2), the driver circuit 431 pulls all the trigger signals (TRIG1-TRIGN) high, as close to VBB as possible, to make the stacked NFET clamps (433, 435, 437, and 439) as conductive as possible. In the embodiment shown, at least some of the trigger signals shown are produced with multiple node assertion paths responsive to the detection signals for pulling a node of the trigger path towards an asserted voltage during an ESD event.

Figure 5:
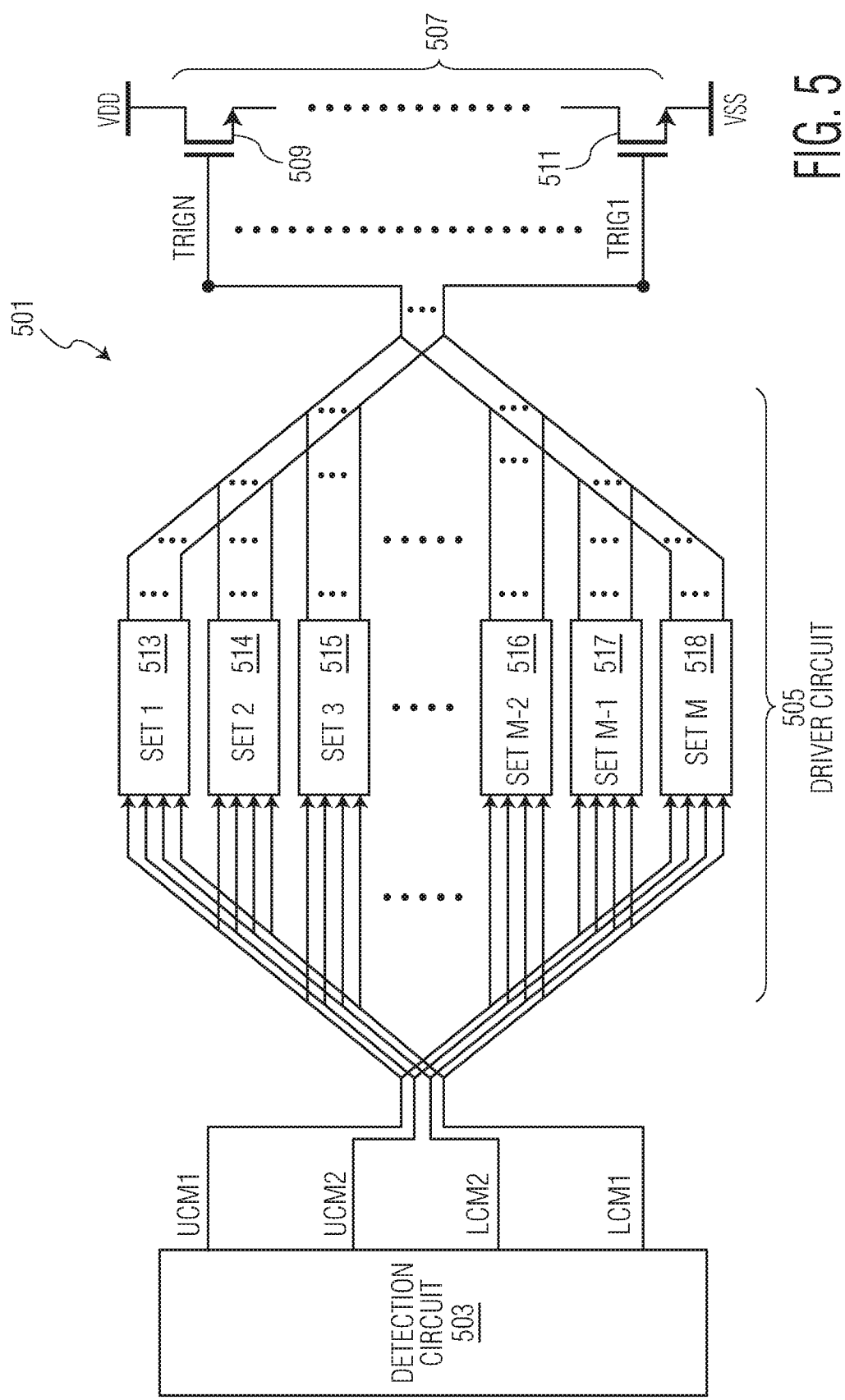
FIG. 5 is a circuit diagram of an ESD protection circuit according to another embodiment of the present invention.

FIG. 5 is a circuit diagram of an ESD protection circuit 501 according to another embodiment. Circuit 501 includes a detection circuit 503 including two current mirrors (not shown) for producing the four detection signals UCM1, UCM2, LCM1, and LCM2, which are produced in a similar manner to the detection signals of detection circuits 201, 301, or 402.

In the embodiment shown, driver circuit 505 includes multiple trigger path portion sets 513-518, each for providing outputs that are added in parallel to form multiple stacked trigger signals (TRIG1-TRIGN) that added in parallel to drive stacked clamps 507 (with clamps 509 and 511 shown in FIG. 5). In the embodiment shown, each path portion set includes inputs to receive at least one of the four detection signals (UCM1, UCM2, LCM1, and LCM2) produced by detection circuit 503.

Each trigger path portion set (513-518) can be tailored to provide signals of particular speed and strength characteristics that are combined with the other signals of the other path portion sets to provide each stacked trigger signal with an overall desired speed and strength profile, and accordingly to provide an overall desired ESD response by circuit 501. Although each path portion set is shown as receiving all four of the detection signals, in some embodiments, some of the path portion sets may utilize fewer than all four detection signals in providing their signals. Also, in some embodiments, some of the path portion sets (513-518) may share circuitry with other path portion sets. For example, referring to FIG. 3, one signal path 341 for producing the TRIG1 signal includes inverters 343, 345, and 347 and the other signal path 349 includes transistor 351 and inverter 347.

In some embodiments, providing a detection circuit that includes current mirrors for generating multiple detection signals may enable a driver circuit to implement multiple node assertion paths for pulling a node towards an assertion state during an ESD event. The use of multiple node assertion paths may provide for trigger signals that can have asserted signal parameters of drive strength and speed that tailored to desired values over the entire ESD event. Such tailoring of the drive signals may provide for a desired clamp conductance and a desired VDD stress profile over the entire ESD event.

In one embodiment, a circuit includes a first current mirror coupled to a first power rail and including a master device and a mirror device. The first current mirror including a first output from a current electrode of the master device of the first current mirror configured to provide a first detection signal indicative of an ESD event and a second output from a current electrode of the mirror device of the first current mirror configured to provide a second detection signal indicative of the ESD event. The circuit includes a second current mirror coupled to a second power rail and including a master device and a mirror device. The second current mirror including a first output from a current electrode of the master device of the second current mirror configured to provide a third detection signal indicative of the ESD event and a second output from a current electrode of the mirror device of the second current mirror configured to provide a fourth detection signal indicative of the ESD event. The circuit includes a first trigger path including inputs to receive at least two of the first, second, third, and fourth detection signals and an output to provide a first trigger signal to a first ESD clamp device wherein the first trigger signal is configured to enable the first ESD clamp device in response to the ESD event. The first trigger signal is provided based on the at least two of the first, second, third, and fourth detection signals. The circuit includes a second trigger path including an input to receive at least an other one of the first, second, third, and fourth detection signals and an output to provide a second trigger signal to a second ESD clamp device wherein the second trigger signal is configured to enable the second ESD clamp device in response to the ESD event, wherein the second trigger signal is provides based on at least the other one of the first, second, third, and fourth signals.

In another embodiment, a circuit includes a first current mirror coupled to a first power rail and including a master device and a mirror device. The first current mirror including a first output from a current electrode of the master device of the first current mirror configured to provide a first detection signal indicative of an ESD event and a second output from a current electrode of the mirror device of the first current mirror configured to provide a second detection signal indicative of the ESD event. The circuit includes a second current mirror coupled to a second power rail and including a master device and a mirror device. The second current mirror including a first output from a current electrode of the master device of the second current mirror configured to provide a third detection signal indicative of the ESD event and a second output from a current electrode of the mirror device of the second current mirror configured to provide a fourth detection signal indicative of the ESD event. The circuit includes driver circuitry configured to provide a first trigger signal to a first ESD clamp device wherein the first trigger signal is asserted during an ESD event to enable the first ESD clamp device and a second trigger signal to a second ESD clamp device wherein the second trigger signal is asserted during an ESD event to enable the second ESD clamp device. The driver circuitry includes a first node assertion path configured to pull a voltage of a first circuit node in the driver circuitry to its asserted state during an ESD event based on at least a first one of the first, second, third, and fourth detection signals. The driver circuitry includes a second node assertion path configured to pull a voltage of a second circuit node in the driver circuitry to its asserted state during an ESD event based on at least a second one of the first, second, third, and fourth detection signals. The driver circuitry includes a third node assertion path configured to pull a voltage of a third circuit node in the driver circuitry to its asserted state during an ESD event base on at least a third one of the first, second, third, and fourth detection signals.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit comprising:
a first current mirror coupled to a first power rail and including a master device and a mirror device, the first current mirror including a first output from a current electrode of the master device of the first current mirror configured to provide a first detection signal indicative of an ESD event and a second output from a current electrode of the mirror device of the first current mirror configured to provide a second detection signal indicative of the ESD event;
a second current mirror coupled to a second power rail and including a master device and a mirror device, the second current mirror including a first output from a current electrode of the master device of the second current mirror configured to provide a third detection signal indicative of the ESD event and a second output from a current electrode of the mirror device of the second current mirror configured to provide a fourth detection signal indicative of the ESD event;
a first trigger path including inputs to receive at least two of the first, second, third, and fourth detection signals and an output to provide a first trigger signal to a first ESD clamp device wherein the first trigger signal is configured to enable the first ESD clamp device in response to the ESD event, wherein the first trigger signal is provided based on the at least two of the first, second, third, and fourth detection signals; and
a second trigger path including an input to receive at least an other one of the first, second, third, and fourth detection signals and an output to provide a second trigger signal to a second ESD clamp device wherein the second trigger signal is configured to enable the second ESD clamp device in response to the ESD event, wherein the second trigger signal is provided based on at least the other one of the first, second, third, and fourth signals.

2. The circuit of claim 1, wherein the first trigger path comprises:
a series of buffers, wherein the series of buffers receives at least one of the at least two of the first, second, third, and fourth detection signals and an output of the series of buffers is connected to an output node that provides the first trigger signal; and
a node assertion path in parallel to at least a portion of the series of buffers and including an input to receive an other one of the at least two of the first, second, third, and fourth detection signals and including an output coupled to a node of the series of buffers.

3. The circuit of claim 2, wherein the second trigger path comprises:
a second series of buffers which includes an input to receive the other one of the first, second, third, and fourth detection signals and an output connected to a second output node to provide the second trigger signal.

4. The circuit of claim 3, wherein:
the series of buffers receives the second detection signal; the input of the node assertion path of the first trigger path receives the first detection signal.

5. The circuit of claim 4 wherein the second series of buffers receives the fourth detection signal.

6. The circuit of claim 2, wherein the first power rail is characterized as a higher voltage power rail than the second power rail, and wherein:
the series of buffers receives the second detection signal; the input of the node assertion path of the first trigger path receives the first detection signal.

7. The circuit of claim 2, wherein the first power rail is characterized as a lower voltage power rail than the second power rail wherein:
the series of buffers receives the second detection signal; the input of the node assertion path of the first trigger path receives the first detection signal.

8. The circuit of claim 2, wherein the node assertion path of the first trigger path comprises a device coupled between the first power rail and the node and controlled by the other one of the at least two of the first, second, third, and fourth detection signals wherein the device is configured to pull a voltage of the node towards a voltage of the first power rail during the ESD event.

9. The circuit of claim 2 wherein the node assertion path is characterized as a faster assertion path in pulling a voltage of the node to an asserted voltage during an ESD event than the series of buffers.

10. The circuit of claim 1, further comprising:
a node assertion device including a first electrode coupled to a first circuit node of the first trigger path, a second current electrode coupled to the second power rail, and a control electrode coupled to receive the third or fourth detection signal wherein the first trigger path asserts the first trigger signal based at least one the first or second detection signal.

11. The circuit of claim 10 further comprising:
a second node assertion device including a first electrode coupled to the first circuit node of the first trigger path, a second current electrode coupled to the second power rail, and a control electrode coupled to receive an inverted signal of the other of the third or fourth detection signal not received by the control electrode of the node assertion device.

12. A circuit comprising:
a first current mirror coupled to a first power rail and including a master device and a mirror device, the first current mirror including a first output from a current electrode of the master device of the first current mirror configured to provide a first detection signal indicative of an ESD event and a second output from a current electrode of the mirror device of the first current mirror configured to provide a second detection signal indicative of the ESD event;
a second current mirror coupled to a second power rail and including a master device and a mirror device, the second current mirror including a first output from a current electrode of the master device of the second current mirror configured to provide a third detection signal indicative of the ESD event and a second output from a current electrode of the mirror device of the second current mirror configured to provide a fourth detection signal indicative of the ESD event;
driver circuitry configured to provide a first trigger signal to a first ESD clamp device wherein the first trigger signal is asserted during an ESD event to enable the first ESD clamp device and a second trigger signal to a second ESD clamp device wherein the second trigger signal is asserted during an ESD event to enable the second ESD clamp device, wherein the driver circuitry comprises:
 a first node assertion path configured to pull a voltage of a first circuit node in the driver circuitry to its asserted state during an ESD event based on at least a first one of the first, second, third, and fourth detection signals;
 a second node assertion path configured to pull a voltage of a second circuit node in the driver circuitry to its asserted state during an ESD event based on at least a second one of the first, second, third, and fourth detection signals; and
 a third node assertion path configured to pull a voltage of a third circuit node in the driver circuitry to its asserted state during an ESD event base on at least a third one of the first, second, third, and fourth detection signals.

13. The circuit of claim 12, wherein:
the first circuit node is at a control electrode of the first ESD clamp device, and the first node assertion path pulls the voltage of the first circuit node to its asserted state during the ESD event based on the first or second detection signals;
the second circuit node and the first circuit node are the same circuit node, and the second assertion path pulls the voltage of the first circuit node to its asserted state during the ESD event based on at least an other of the first or second detection signals; and
the second trigger signal is asserted in response to the third circuit node, and the third node assertion path pulls the voltage of the third circuit node to its asserted state during the ESD event based at least on the third or fourth detection signal.

14. The circuit of claim 12, wherein:
the first node assertion path comprises a first device including a first current electrode coupled to the first circuit node, a second current electrode coupled to the second power rail, and a control electrode coupled to receive one of the third or fourth detection signal;
the first circuit node and the second circuit node are the same circuit node, the second node assertion path comprises a second device including a first current electrode coupled to the first circuit node, a second current electrode coupled to the second power rail, and a control electrode coupled to a node whose assertion state is dependent upon an other one of the third or fourth detection signal; and
the third node assertion path is configured to pull the voltage of the third circuit node in the driver circuitry to its asserted state during the ESD event based on the first or second detection signal, wherein the first trigger signal is asserted in response to at least the third circuit node.

15. The circuit of claim 14, wherein the third node assertion path comprises two transistors of opposite conductivity coupled between the first power rail and the first circuit node wherein a first current electrode of each of the two transistors is connected together at the third circuit node.

16. The circuit of claim 12, wherein the driver circuitry further comprises:
a fourth node assertion path configured to pull a voltage of a fourth circuit node in the driver circuitry to its asserted state during the ESD event base on at least a fourth one of the first, second, third, and fourth detection signals.

17. The circuit of claim 12, wherein the driver circuitry wherein:
the first node assertion path is configured to pull the voltage of the first circuit node in the driver circuitry to its asserted state during an ESD event base on the third or fourth detection signal, wherein the second trigger signal is asserted in response to at least the first circuit node.

18. The circuit of claim 17, wherein:
the first node assertion path comprises at least one buffer coupled between the second current mirror and the first circuit node, the at least one buffer includes an input to receive one of the third or fourth detection signals;
the second node assertion path comprises a device including a first current electrode coupled to the first circuit node, a second current electrode coupled to the second power rail, and a control electrode coupled to receive an other of the third or fourth detection signals, wherein the first circuit node and the second circuit node are the same circuit node.

19. The circuit of claim 12, wherein:
the first node assertion path comprises a first device including a first current electrode coupled to the first circuit node, a second current electrode coupled to the second power rail, and a control electrode coupled to receive the third or fourth detection signal, wherein the second trigger signal is asserted in response to at least the first circuit node;

the second circuit node and the first circuit node are the same circuit node, and the second node assertion path pulls the voltage of the first circuit node to its asserted state during the ESD event based on at least an other of the third or fourth detection signals; and the third node assertion path is configured to pull the voltage of the third circuit node in the driver circuitry to its asserted state during the ESD event based on the first or second detection signal, wherein the first trigger signal is asserted in response to the third circuit node.

20. The circuit of claim 12 wherein the first and second detection signals are characterized as being complementary to each other and the third and fourth detection signals are characterized as being complementary to each other.

* * * * *